United States Patent
Tomoto

(10) Patent No.: US 11,417,915 B2
(45) Date of Patent: Aug. 16, 2022

(54) BATTERY UNIT

(71) Applicant: DENSO CORPORATION, Kariya (JP)

(72) Inventor: Shunsuke Tomoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 199 days.

(21) Appl. No.: 16/939,453

(22) Filed: Jul. 27, 2020

(65) Prior Publication Data
US 2021/0028504 A1 Jan. 28, 2021

(30) Foreign Application Priority Data

Jul. 25, 2019 (JP) .............................. JP2019-136969

(51) Int. Cl.
*H01M 10/42* (2006.01)
*B60R 16/04* (2006.01)
*G01R 31/396* (2019.01)
*H02J 7/00* (2006.01)
*H05K 1/18* (2006.01)
(Continued)

(52) U.S. Cl.
CPC ........... *H01M 10/425* (2013.01); *B60R 16/04* (2013.01); *G01R 31/396* (2019.01); *H01M 10/625* (2015.04); *H01M 10/6551* (2015.04); *H01M 50/20* (2021.01); *H02J 7/0031* (2013.01); *H02J 7/00043* (2020.01); *H05K 1/18* (2013.01); *H01M 2220/20* (2013.01)

(58) Field of Classification Search
CPC ............. H01M 10/425; H01M 10/625; H01M 10/6551; H01M 50/20; H01M 2220/20; H01M 10/613; H01M 10/6554; H01M 10/658; H01M 50/204; H01M 50/249; H01M 50/284; H01M 50/287; H01M 50/289; H01M 10/0525; H01M 10/482; H01M 10/488; B60R 16/04; G01R 31/396; H02J 7/00043; H02J 7/0031; H05K 1/18; Y02E 60/10
USPC ......................................................... 320/128
See application file for complete search history.

(56) References Cited

U.S. PATENT DOCUMENTS

| 5,694,293 A * | 12/1997 | Seto ...................... G06F 1/1616 361/679.46 |
| 10,082,542 B2 * | 9/2018 | Tanaka ................... B29C 66/322 |

(Continued)

FOREIGN PATENT DOCUMENTS

| JP | 2000228178 A * | 8/2000 | .......... B60L 11/1809 |
| JP | 2008-238946 A | 10/2008 | |
| WO | WO-2006059511 A1 * | 6/2006 | .......... H01M 10/482 |

*Primary Examiner* — M Baye Diao
(74) *Attorney, Agent, or Firm* — Oliff PLC

(57) ABSTRACT

A battery unit including a battery, a circuit board, a switching device which achieves charge or discharge of the battery, and a casing made up of a bottom and a peripheral wall. The battery is disposed on the bottom. The circuit board is arranged farther away from the bottom than from the battery. The switching device is located closer to the bottom than the circuit board is. The switching device has a visible area visually or optically perceived, as inwardly facing inside the casing from outside the circuit board, and includes a data-retaining area on which data on characteristics of the switching device is provided, for example, in the form of a code. This structure facilitates the ease with which the data on the characteristics of the switching device is visually or optically read out of the data-retaining area without having to have an increased size of the battery unit.

5 Claims, 9 Drawing Sheets

(51) Int. Cl.
*H01M 10/6551* (2014.01)
*H01M 10/625* (2014.01)
*H01M 50/20* (2021.01)

(56) References Cited

U.S. PATENT DOCUMENTS

| | | | |
|---|---|---|---|
| 10,651,519 B2 * | 5/2020 | Inoue | H01M 10/425 |
| 2014/0370367 A1 * | 12/2014 | Higuchi | H01M 50/211 |
| | | | 429/158 |
| 2018/0166756 A1 * | 6/2018 | Inoue | H01M 10/482 |

* cited by examiner

BATTERY UNIT

CROSS REFERENCE TO RELATED DOCUMENT

The present application claims the benefit of priority of Japanese Patent Application No. 2019-136969 filed on Jul. 25, 2019, the disclosure of which is incorporated herein by reference.

BACKGROUND

1 Technical Field

This disclosure relates generally to a battery unit for use in a vehicle, such as an automobile.

2 Background Art

Techniques are known which install a storage battery and a circuit board in a casing in the form of a battery unit. The circuit board has a controller mounted thereon. Switching devices are electrically connected to the circuit board in the battery unit to achieve delivery of electrical power between the storage battery and an electrical device arranged outside the battery unit. The layout in which the switching devices are connected to the circuit board in the battery unit enables the battery unit to be reduced in size thereof as compared with a case where the switching devices are arranged outside the circuit board.

In order to minimize a deterioration of charge/discharge ability of the battery unit arising from a variation in characteristics among the switching devices, techniques are known which store data on characteristics of the switching devices in the controller mounted on the circuit board. For example, Japanese patent first publication No. 2008-238946 teaches attaching a bar code which represents characteristics of a controlled object to the controlled object itself. The bar code is read by, for example, a barcode reader and written in a controller on a circuit board. This facilitates a step of inputting the data on characteristics into the controller as compared with a case in which the data on characteristic is read out from a storage medium installed in the controlled object and written in the controller.

Some typical battery units are designed to have switching devices directly secured to a heat dissipator arranged in a casing in order to release thermal energy generated by the switching devices. When the heat dissipator is disposed near a rear portion of a circuit board in the battery unit, and the switching devices are arranged on the rear portion of the circuit board near the heat dissipator, it results in a reduction in visibility of the switching devices. This also results in a reduction in visibility of the bar code. If it is difficult to read data from bar codes attached to the switching devices, it will require a need for installing on each of the switching devices a storage medium in which data on characteristics of the switching device is retained and reading the data out of the storage medium. This leads to complexity of steps to write the data on characteristics in the controller. Alternatively, when the switching devices are arranged outside the circuit board without physically overlapping the circuit board, it may result in an increased size of the battery unit.

SUMMARY

It is, thus, an object of this disclosure to provide a battery unit which ensures a desired degree of visibility or optical perception of coded data without having to have an increased size thereof.

According to one aspect of this disclosure, there is provided a battery unit which comprises: (a) a battery; (b) a storage casing which includes a bottom and a peripheral wall, the bottom and the peripheral wall defining an inner space in which the battery is disposed; (c) a circuit board which is disposed inside the storage casing and on which a controller is mounted to control input or output of electrical power to or from the battery, the circuit board having an outer surface facing outside the storage casing and an inner surface facing the bottom of the storage casing, and (d) a switching device which works to open or close an electrical power path leading to the battery in response to a switching signal outputted from the controller. The battery is disposed on the bottom. The circuit board is arranged farther away from the bottom than from the battery. The switching device is arranged behind the circuit board within the storage casing, as viewed facing an interior of the storage casing from outside the outer surface of the circuit board. A visible area is defined inside the storage casing. The visible area is exposed outside the circuit board to secure visibility of the visible area, as viewed inwardly facing inside the storage casing from outside the outer surface of the circuit board. The visible area includes a data retaining area on which data on characteristics of the switching device is provided.

The battery unit equipped with the switching device which controls input or output of electrical energy into or from the battery is designed to have the controller mounted on the circuit board to which the switching device is connected in order to reduce the size of the battery unit. This type of battery unit may have the circuit board arranged above the battery and also have the switching device arranged behind the circuit board, as inwardly facing inside the storage casing from outside the circuit board. The layout of the battery and the circuit board results in a reduction in visibility of the switching device from outside the battery unit, but it is required to secure optical perception of the data on characteristics provided in the data-retaining area in order to facilitate writing or transferring the data to the controller.

In order to meet the above requirement, the battery unit is, as described above, designed to have the data-retaining area which is located within the visible area where the data on characteristics of the switching device is visually or optically perceived, that is, enabled to be read out of the data-retaining area. The above layout of the data-retaining area in the visible area facilitates writing or transfer of the data on characteristics to the controller without need for increasing the size of the battery unit.

In the preferred mode of the disclosure, the peripheral wall of the storage casing includes a first side wall and a second side wall which are opposed to each other through the space in a given direction. The circuit board is located closer to the first side wall than the switching device is, while the switching device is located closer to the second side wall than the circuit board is.

The above layout of the circuit board arranged closer to the first side wall enables the battery unit to be reduced in size and also create space which is located closer to the second side wall and unoccupied by the circuit board. The switching device is arranged closer to the second side wall, thereby enabling the data on characteristics of the switching device to be visually or optically perceived using the space.

In third preferred mode of the disclosure, the switching device has a first end closer to the first side wall of the peripheral wall of the storage casing and a second end closer to the second side wall of the peripheral wall of the storage casing. The first end has installed thereon connecting terminals connecting with the circuit board. The data retaining area is located closer to the second end than to the first end on a selected surface of the switching device.

The switching device is designed to have the connecting terminals on the first end closer to the first side wall of the peripheral wall than the second end is. This facilitates arrangement of the switching device close to the second side wall and also enhances the visibility of the data-retaining area arranged close to the second side wall.

In the fourth preferred mode of the disclosure, the switching device has a portion protruding outside the circuit board in a direction parallel to a major surface of the circuit board. A height of a portion of the second side wall on which the switching device is mounted from the bottom is smaller than a distance between the bottom and a lower surface of the circuit board.

If the switching device is covered fully with the circuit board, as viewed from outside the battery unit, it will result in a deterioration of visibility of the data-retaining area. Additionally, if the height of the portion of the second side wall on which the switching device is mounted from the bottom is larger than the distance between the bottom and the lower surface of the circuit board, it will cause the circuit board to reduce the visibility of the data-retaining area. These drawbacks are eliminated by the above structure of the battery unit.

In the fifth preferred mode of the disclosure, the peripheral wall has a heat dissipator which releases heat generated by the switching device. The heat dissipator has a heat releasing surface on which the switching device is mounted and which is located closer to the bottom than the lower surface of the circuit board is.

When the peripheral wall of the storage casing has the heat dissipator, and the heat releasing surface of the heat dissipator is located closer to the bottom than the lower surface of the circuit board is, it results in a need for placing the switching device behind the circuit board, as viewed from outside an upper portion of the battery unit, to mount the switching device on the heat releasing surface. The above structure meets such a need without having to increase the size of the battery unit.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings.

DESCRIPTION OF THE PREFERRED EMBODIMENTS

First Embodiment

The first embodiment in which a battery unit is used in a power system installed in a vehicle will be described below with reference to the drawings. The power system works to control charge or discharge of an electrical storage system which delivers electrical power to various types of electrical loads installed in the vehicle. The vehicle is equipped with an internal combustion engine, an in-vehicle ECU working to control operations of the engine and other devices, a rotating electrical machine which is driven by rotation of the engine or an axle of the vehicle to generate electricity in a generator mode and also operates in a motor mode to drive the engine and the axle of the vehicle, an electrical storage system charged by the electricity generated by the rotating electrical machine, and various types of electrical loads. The rotating electrical machine is engineered as an ISG (Integrated Starter Generator). The electrical storage system is made of a lead-acid battery and a lithium-ion battery. The Li-battery unit 10 made of the lithium-ion battery will be described below in detail.

Figure 1:
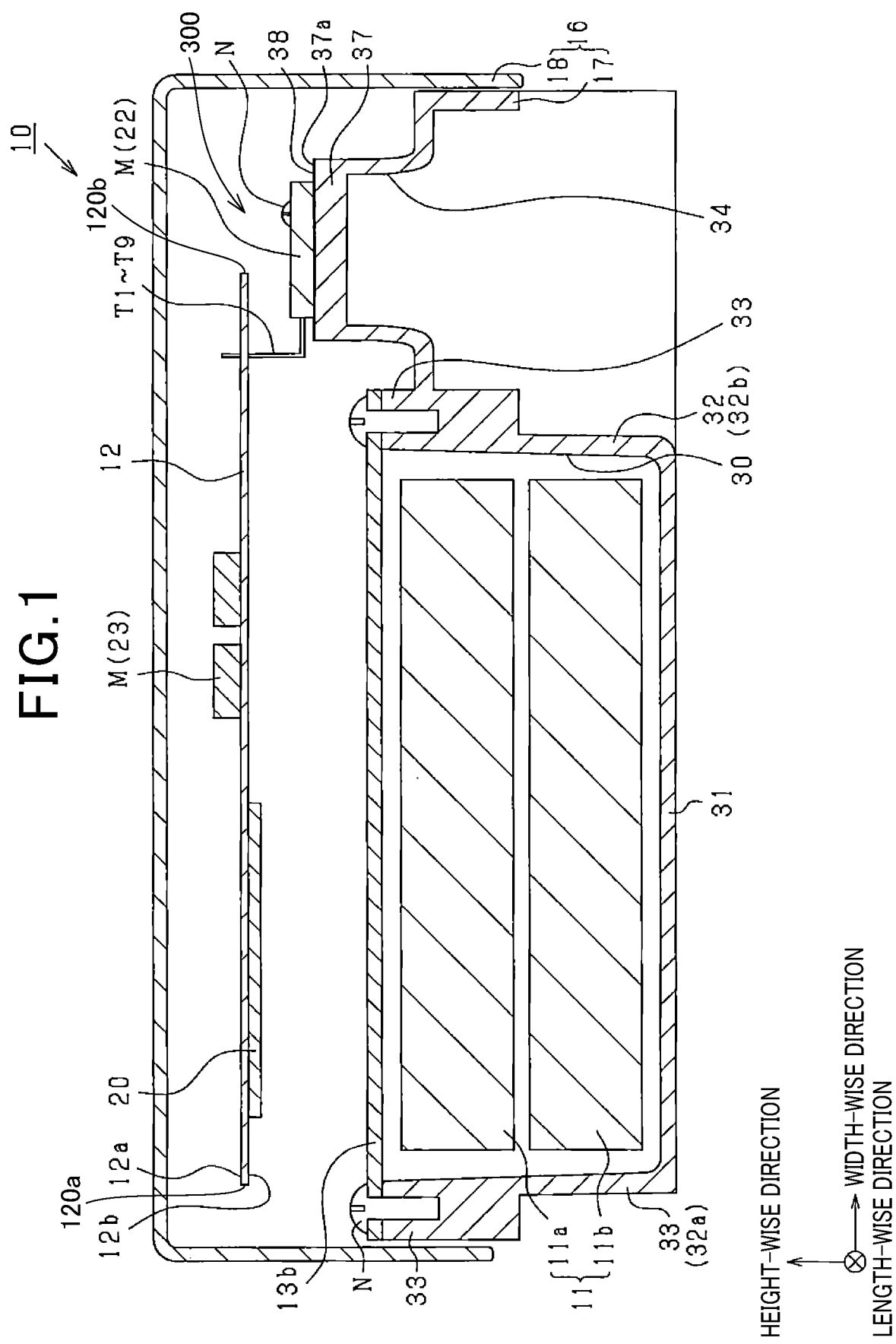
FIG. 1 is a vertical sectional view which illustrates a battery unit according to the first embodiment.
Figure 2:
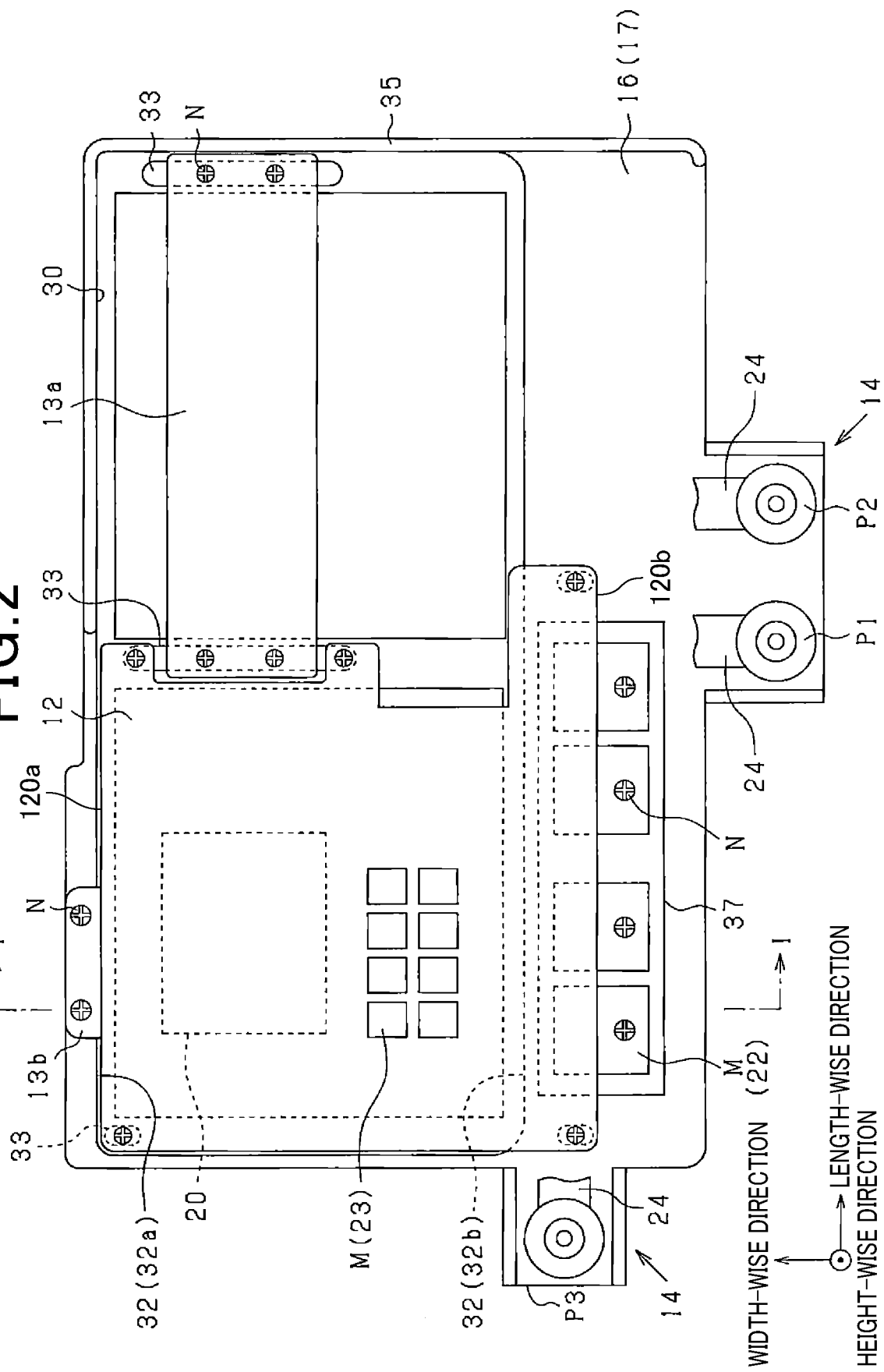
FIG. 2 is a top view of the batter unit in FIG. 1.

First, an overall structure of the battery unit 10 will be discussed using FIGS. 1 and 2. For the sake of simplicity, a vertical direction (i.e., a height-wise direction) of the battery unit 10 is defined based on horizontal orientation of the battery unit 10 illustrated in FIG. 1. FIG. 1 is a vertical sectional view of the battery 10. FIG. 2 is a top view of the battery unit 10 from which the cover 18 is removed. FIG. 1 is a sectional view of the battery unit 10 taken along the line I-I in FIG. 2.

The battery unit 10 includes the battery module 11 made up of a plurality of can cells 11a, the circuit board 12 operating to control charge or discharge of the battery module 11, the terminal unit 14 through which electrical energy is inputted into or outputted from the battery unit 10, and the storage casing 16 in which the battery module 11 is disposed. The storage casing 16 is of a cuboid shape and includes the base 17 secured to a given mount portion of the battery unit 10 and the cover 18 arranged above the base 17. Each of the base 17 and the cover 18 is made from a metallic material, such as aluminum. In this embodiment, the battery module 11 is designed as a storage battery.

The battery module 11 and the circuit board 12 are laid to overlap each other in the vertical direction. The circuit board 12 is located above the battery module 11. The battery module 11 and the circuit board 12 are secured to the base 17 using the fasteners N, such as vises or bolts. The battery module 11 is shaped to have a stepped upper surface, that is, an upper surface and a lower surface to which the separate plates 13a and 13b are secured. Specifically, the cells 11a are broken into a two groups: a triple cell stack made up of a stack of three of the cells 11a and a double cell stack made up of a stack of the remaining two cells 11a. The triple cell stack has the upper surface of the battery module 11, while the double cell stack has the lower surface of the battery module 11. The plate 13a is attached to the upper surface of the triple cell stack. The plate 13b is attach to the lower surface of the double cell stack. The base 17 has the protective wall 35 which surrounds the triple cell stack and has a height substantially identical with that of the triple stack cell.

The plates 13a and 13b serve as deformation stoppers to minimize undesirable deformation of the battery module 11. The plates 13a and 13b are each made of, for example, a high-rigidity metallic plate. The circuit board 12 is arranged above the plate 13b. The plate 13a lies flush with the circuit board 12 in a direction perpendicular to the height-wise direction. In other words, the plate 13a and the circuit board 12 are located at the same level in the vertical direction. The cover 18 is fitted on the base 17 from above to have the battery module 11 and the circuit board 12 arranged inside the storage casing 16.

The terminal unit 14 is arranged on an outer periphery of the base 17 and serves to deliver electrical power, as generated by the cells 11a, to power-supplied devices, such as a lead-acid battery, a rotating electrical machine, and electrical loads, which are arranged outside the battery unit 10 and also receive electrical power therefrom. Specifically, the terminal unit 14 is equipped with the output terminals P connected to the power-supplied devices. More specifically, the terminal unit 14 is, as clearly illustrated in FIG. 3, equipped with the first output terminal P1 connected to, for example, the lead-acid battery 101 and the electrical load 104 and the second output terminal P2 connected to the rotating electrical machine 103. The terminal unit 14 is also equipped with the third output terminal P3 connected to the electrical load 15 to which electrical power is not allowed to fail to be delivered. The output terminals P (i.e., P1 to P3) are mounted on a terminal block made from an insulating material and joined to respective bus bars 24 which define power paths.

The structural features of the battery unit 10 will be described below in detail. The base 17 of the storage casing 16 will first be discussed.

The base 17 includes the bottom 31 and the peripheral wall 32 extending upward from the bottom 31. The bottom 31 is of substantially a square shape. The peripheral wall 32 surrounds a peripheral edge of the bottom 31. The bottom 31 and the peripheral wall 32 define the inner space 30 (i.e., an inner chamber) surrounded thereby. The battery module 11 is disposed inside the space 30. The space 30 has an upper opening.

Specifically, the battery module 11 is disposed to face the bottom 31. In other words, the battery module 11 is firmly mounted or fixed on the bottom 31 and surrounded by the peripheral wall 32. The battery module 11 has the cells 11a placed in alignment with each other on the bottom 31. The base 17 (i.e., the storage casing 16) is shaped to have a longitudinal (i.e., lengthwise) direction in which the cells 11a are aligned with each other. The base 17 is also shaped to have a widthwise direction perpendicular to the longitudinal direction thereof. In other words, the base 17 has a length and a width shorter than the length. The widthwise direction of the base 17 will also be referred to below as a given direction.

The base 17 has a plurality of fastening portions 33 to which the battery module 11, the circuit board 12, and the plates 13 (i.e., the plates 13a and 13b) are secured. The fastening portions 33 protrude from the bottom 31 or the peripheral wall 32 in the form of a boss and are used as seats on which the battery module 11, the circuit board 12, and the plates 13 are located at respective given levels in the vertical direction. Each of the fastening portions 33 has a threaded hole formed in an upper end thereof. The battery module 11, the circuit board 12, and the plates 13 are placed on the upper ends of the fastening portions 33 and firmly secured thereto using the fasteners N.

The peripheral wall 32 of the base 17 includes the device mount base 37 on which the semiconductor power devices 22 are mounted for electrical power control. The device mount base 37 has the flat upper surface 37a. The semiconductor power devices 22 are firmly mounted by the fasteners N on the upper surface 37a through the insulating sheet 38. The device mount base 37 functions as a heat dissipator from which thermal energy, generated by the semiconductor power devices 22 is released to the outside. The heat-dissipating space 34 is created beneath the device mount base 37. The heat generated by the semiconductor power devices 22 is first transferred to the upper surface 37a (i.e., a heat releasing surface) of the device mount base 37 and then emitted outside the battery unit 10 through the heat-dissipating space 34. The semiconductor power devices 22 will also be referred to as switching devices.

Next, the circuit board 12 will be described below. The circuit board 12 is implemented by a printed-circuit board on which an electrical circuit is formed. The circuit board 12 has major board surfaces: the upper surface (also called an outer surface) 12a and the lower surface (also called an inner surface) 12b on or to which electronic devices are mounted or joined. The electronic devices include the arithmetic control device 20 working as a controller to execute charge or discharge tasks for the battery module 11 and the switching devices M. The arithmetic control device 20 controls on/off operations of the switching devices M to control charge or discharge of the battery module 11 and conductive states of the power paths on the circuit board 12. The switching devices M may be implemented by MOSFETs.

Figure 3:
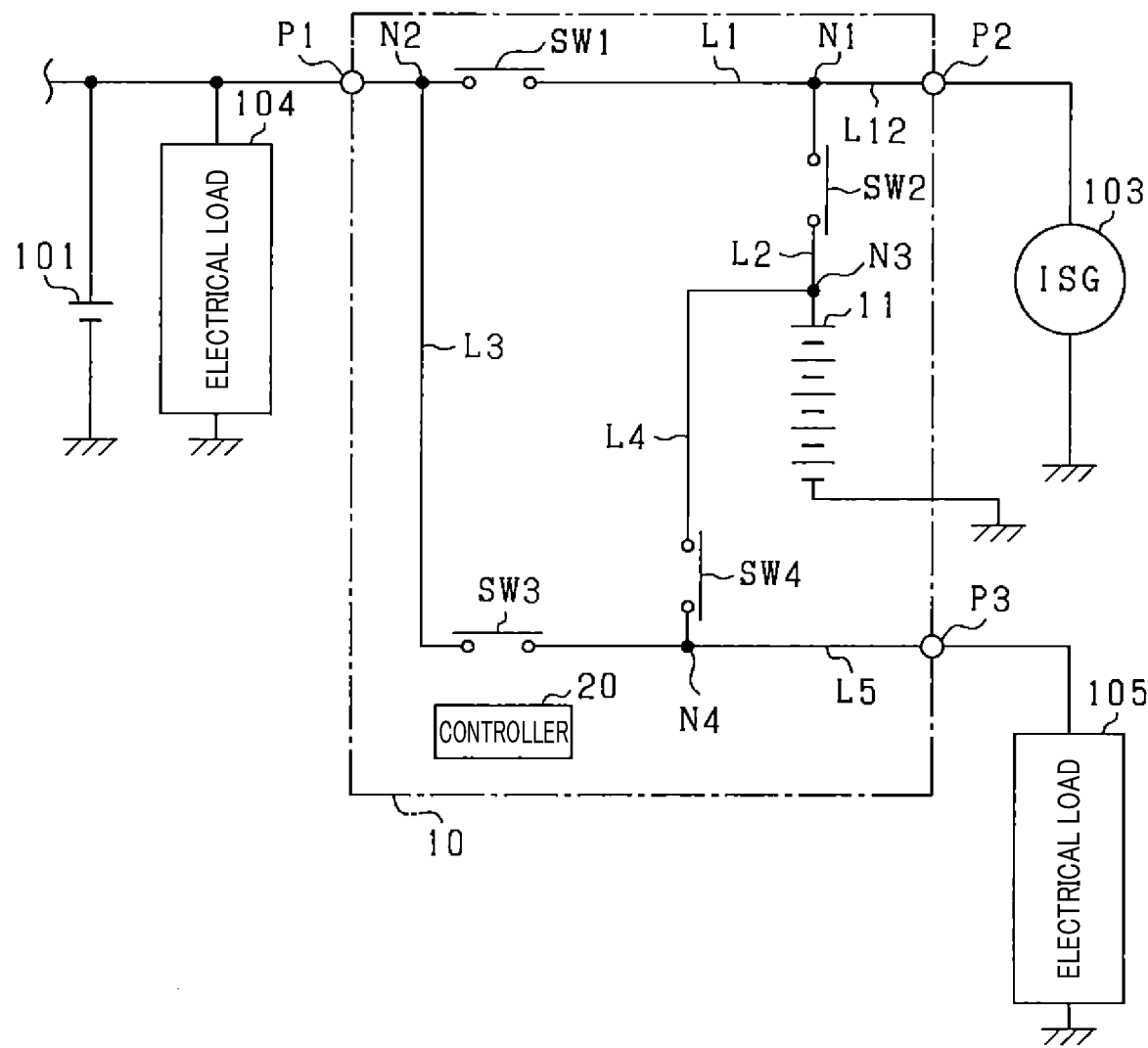
FIG. 3 is a circuit diagram which illustrates an electrical structure of a power system equipped with the battery unit in FIG. 1.

The switching devices M mounted on or joined to the circuit board 12, as clearly illustrated in FIG. 3, include four switches SW1 to SW4. Specifically, the battery unit 10 is equipped with the first electrical power path L1 and the second electrical power path L2. The first electrical power path L1 connects between the first output terminal P1 and the second output terminal P2. The second electrical power path L2 connects between the first junction N1 on the first electrical power path L1 and the battery module 11. The first switch SW1 is arranged between the first output terminal P1 and the first junction N1 on the first electrical power path L1. The second switch SW2 is arranged on the second electrical power path L2.

The third electrical power path L1 is connected at a first end thereof to the second junction N2 between the first output terminal P1 and the first switch SW1 on the first electrical power path L1. The fourth electrical power path L4 is connected at a first end thereof to the third junction N3 between the battery module 11 and the second switch SW2 on the second electrical power path L2. The third and fourth electrical power paths L3 and L4 are connected at second ends thereof to the fourth junction N4. The fourth junction N4 and the third output terminal P3 are connected together by the fifth electrical power path L5. The third switch SW3 and the fourth switch SW4 are mounted on the third and fourth electrical power paths L3 and L4, respectively.

The first and second switches SW1 and SW2 are designed to establish or block flow of a larger amount of electrical current and made of the semiconductor power devices 22. The semiconductor power devices 22 include the switching devices M. The semiconductor power devices 22, therefore, work to open or close the first and second electrical power paths L1 and L2 which connect the first and second output terminals P1 and P2 and the battery module 11 in response to a switching signal outputted from the arithmetic control device 20.

Figure 4:
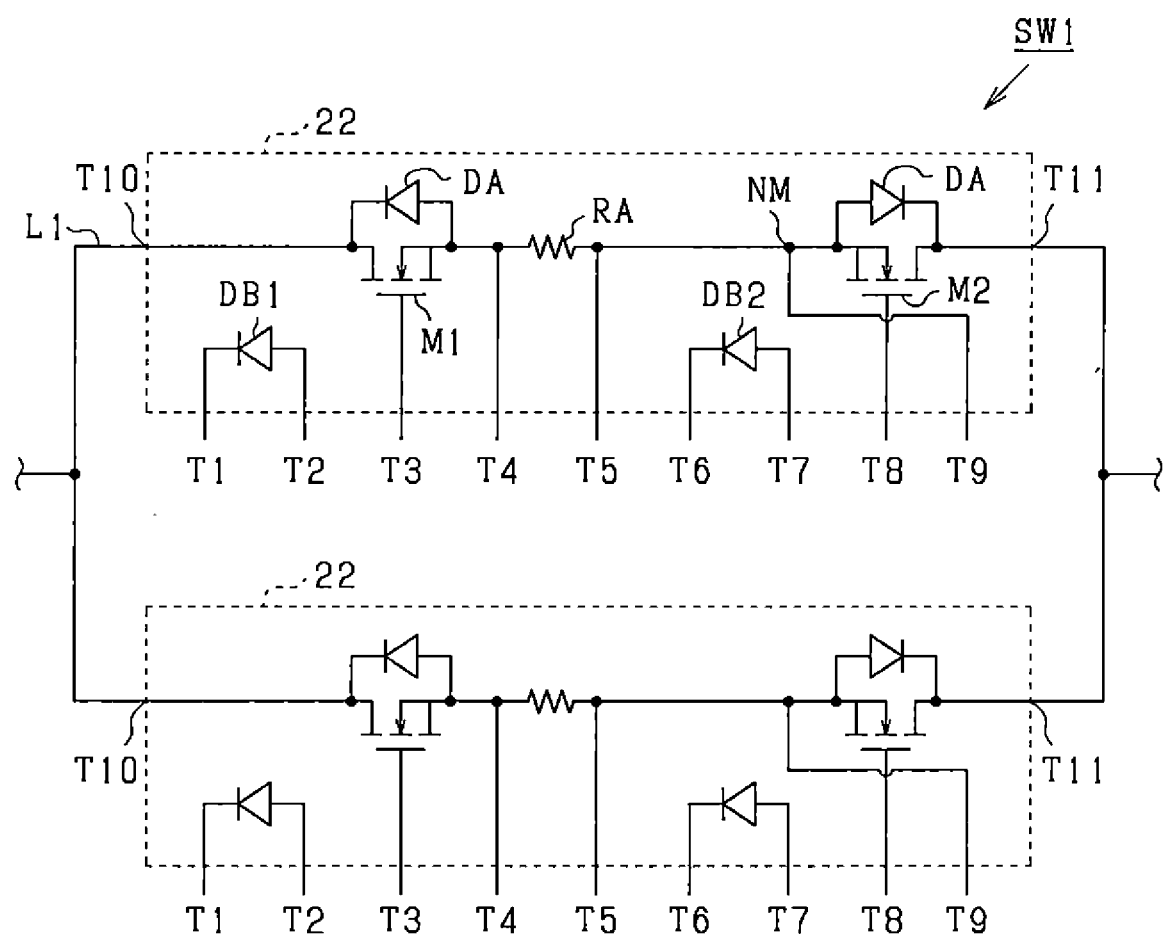
FIG. 4 is a circuit diagram which illustrates an internal structure of a first switch installed in the battery unit in FIG. 1.

The structures of the switches SW1 and SW2 will be described below with reference to FIG. 4. The first switch SW1 is made up of two semiconductor power devices 22 connected in parallel to each other. Each of the semiconductor power devices 22 has the switching devices M1 and M2 connected in series with each other with the parasitic diodes DA oriented in opposite directions.

The resistor RA is disposed between the switching devices M1 and M2 to measure current flowing through the switching devices M1 and M2. Each of the semiconductor power devices 22 also has the thermostatic diodes DB1 and DB2 which measure the temperatures T of the switching devices M1 and M2, respectively. Each of the semiconductor power devices 22, therefore has nine connecting terminals T1 to T9 connected to the devices installed in the semiconductor power device 22. Specifically, the connecting terminals T1 to T9 are connected to gates of the switching devices M1 and M2, electrodes on ends of each of the resistor RA and the thermostatic diodes DB1 and DB2, and the junction NM between the switching device M1 and the switching device M2. Each of the semiconductor power devices 22 also has two connector terminals T10 and T11 leading to the first electrical power path L1.

The second switch SW2 has substantially the same structure as that of the first switch SW1, and explanation thereof in detail will be omitted here. The third and fourth switches SW3 and SW4 are designed to establish or block flow of a smaller amount of current. Each of the third and fourth switches SW3 and SW4 is made up of the power controlling semiconductor devices 23 which are, as illustrated in FIG. 2, lower in current rating than the semiconductor devices 22.

Each of the third and fourth switches SW3 and SW4 has substantially the same structure as that of the first switch SW1. Each of the semiconductor devices 23 includes the single switching device M. Each of the third and fourth switches SW3 and SW4 is, therefore, made up of the four semiconductor devices 23. The semiconductor devices 23 are not equipped with the resistor RA and the thermostatic diodes DB1 and DB2. The third and fourth switches SW3 and SW4, thus, each have a circuit which is similar to that in FIG. 4 and mounted on the circuit board 12.

The arithmetic control device 20, the semiconductor power devices 22, and the semiconductor devices 23 are, as clearly illustrated in FIG. 1, connected to the circuit board 12. Specifically, the arithmetic control device 20 and the semiconductor devices 23 are secured to the circuit board 12, in other words, mounted on the circuit board 12. The semiconductor power devices 22 are connected to the circuit board 12, but secured to the device mount base 37, not the circuit board 12. In other words, the semiconductor power devices 22 are not mounted on the circuit board 12.

Subsequently, the semiconductor power devices 22 will be described below. Each of the semiconductor power devices 22 is made of an integrated circuit on which the switching devices M1 and M2 are fabricated and has formed therein the attachment hole 41 for use in attaching the semiconductor power device 22 to the device mount base 37. When mounted on the device mount base 37, each of the semiconductor power devices 22 has the first and second side surfaces 41a and 42b (which will also be referred to below as first and second ends) opposed to each other in the widthwise direction of the base 17. The first side surface 42a has the connecting terminals T1 to T9 arranged thereon. The second side surface 42b has the connector terminals T10 and T11 arranged thereon.

When secured to the device mount base 37, each of the semiconductor power devices 22 also has the upper surface 40 which faces upward. The upper surface 40 has the data-retaining areas 44. Each of the data-retaining areas 44 has typed or printed thereon one of the two-dimensional codes 45 and 46 which represents data on characteristics of the semiconductor power device 22. For instance, the two-dimensional code 45 retains data on temperature characteristics of the resistor RA installed in the semiconductor power device 22. The two-dimensional code 45 retains data on voltage characteristics of the thermostatic diodes DB1 and DB2 of the semiconductor power device 22. In this disclosure, the upper surface 40 of each of the semiconductor power devices 22 will also be referred to as a selected surface.

Figure 6A:
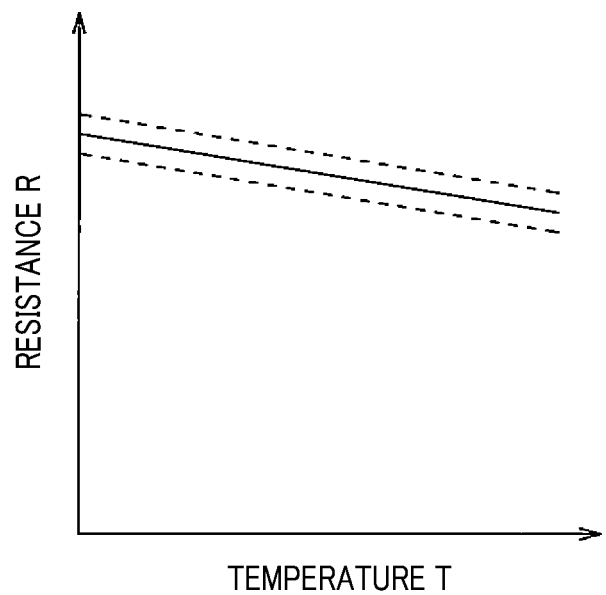
FIG. 6(A) is a graph which represents data on characteristics of a semiconductor power device.
Figure 6B:
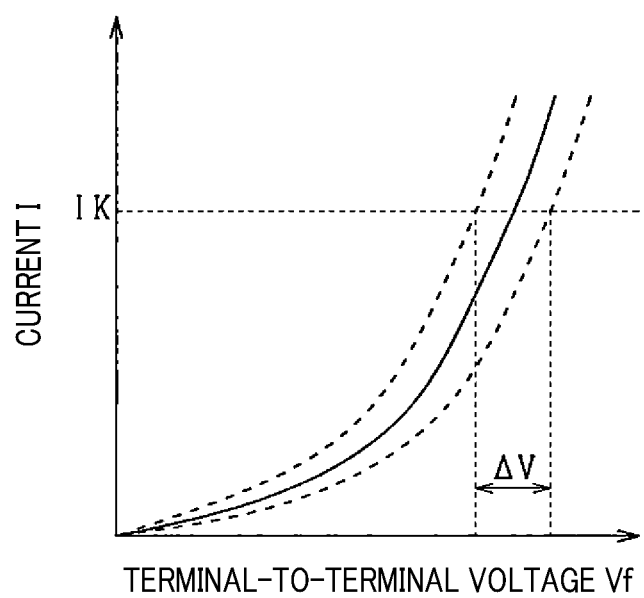
FIG. 6(B) is a graph which represents data on another type of characteristics of a semiconductor power device.

Usually, the semiconductor power devices 22 are managed to have uniform characteristics during manufacture thereof, however, such characteristics may be changed due to production variability or tolerance. For instance, the resistor RA may have, as demonstrated in FIG. 6(A), a variation in resistance value R at a given temperature T. Each of the thermostatic diodes DB1 and DB2 may have, as demonstrated in FIG. 6(B), a variation in terminal-to-terminal voltage Vf when a given current I is flowing therethrough. When the thermostatic diodes DB1 and DB2 have the terminal-to-terminal voltages Vf different from each other within a voltage range ΔV when a reference voltage IK is flowing due to the production variability, it will result in a failure in measuring the temperatures T of the switching devices M1 and M2 accurately using the thermostatic diodes DB1 and DB2.

Accordingly, when each of the semiconductor power devices 22 is produced, data on temperature characteristics of the resistor RA and voltage characteristics of the thermostatic diodes DB1 and DB2 are derived. The two-dimensional codes 45 and 46 are then produced which represent the derived data and are printed on the upper surface 40 of the semiconductor power device 22. After the semiconductor power device 22 is connected to the circuit board 12, and the battery unit 10 is assembled completely, the characteristic data stored in the two-dimensional codes 45 and 46 is read and then retained in a storage device or memory installed in the arithmetic control device 20. This enables the semiconductor power devices 22 to be controlled accurately using the characteristics data on the semiconductor power devices 22.

The semiconductor power devices 22 are connected to the circuit board 12 through the connecting terminals T1 to T9. The semiconductor power devices 22 are, as can be seen in FIG. 1, secured to the device mount base 37 of the base 17. The upper surface 37a of the device mount base 37 on which the semiconductor power devices 22 are fixed is located closer to the bottom 31 than the lower surface 12b of the circuit board 12 is, that is, arranged below the lower surface 12b. In other words, the semiconductor power devices 22 are arranged on a portion of the base 17 farther away from the bottom 31 within the battery unit 10, that is, located behind the circuit board 12, as viewed from above the upper surface of the battery unit 10 (i.e., as viewed inwardly facing the bottom 31).

The semiconductor power devices 22 is, as described above, located behind the circuit board 12, as viewed from above the battery unit 10, which usually results in a reduction in visibility of the semiconductor power devices 22.

Further, in order to reduce the size of the battery unit 10, the circuit board 12 and the semiconductor power devices 22 may be laid to overlap each other in the vertical direction. The semiconductor power devices 22 may be connected to the circuit board 12. This also results in a greater deterioration in visibility of the semiconductor power devices 22, thereby provoking a difficulty in visually perceiving the two-dimensional codes 45 and 46 printed on the upper surface 40 of the semiconductor power devices 22, which leads to a risk that the two-dimensional codes 45 and 46 on the semiconductor power devices 22 may fail to be read. It is, therefore, undesirably necessary to have additional memories installed in the semiconductor power devices 22 to retain the characteristic data therein and read it from the memories after the battery unit 10 is assembled. Alternatively, when the circuit board 12 and the semiconductor power devices 22 are arranged not to overlap each other, in other words, the semiconductor power devices 22 are disposed outside the circuit board 12 in order to secure the visibility of the two-dimensional codes 45 and 46, it results in an increased overall size of the battery unit 10.

In order to eliminate the above drawbacks, the battery unit 10 in this embodiment is designed to have the data-retaining areas 44 located in regions on the upper surfaces 40 of the semiconductor power devices 22 which are optically or visually perceived from above the upper surface of the battery unit 10, as viewed facing the interior of the storage casing 16 from outside the circuit board 12. In other words, if a first imaginary plane is defined to extend substantially parallel to and from a major surface (i.e. mount surface) of the circuit board 12 on which the semiconductor devices 23 are installed, and a second imaginary plane is defined to extend substantially parallel to and from a major surface of the bottom 31 of the storage casing 16, the circuit board 12 is located between the first and second imaginary planes in a vertical direction substantially traversing the first and second imaginary planes. Each of the semiconductor power devices 22 partially protrudes outside the circuit board 12 in a direction extending parallel to the first and second imaginary planes, in other words, laid to partially overlap with the circuit board 12 in the vertical direction. This layout of the circuit board 12 and the semiconductor power devices 22 enables the upper surface 40 of each of the semiconductor power devices 22, as clearly illustrated in FIG. 5, to have an area NR whose side depends upon the layout or configuration of the circuit board 12 and which is located to overlap the circuit board 12 vertically (i.e., the height-wise direction). The area NR is an area which is invisible from above. In other words, if the data-retaining areas 44 are provided within the invisible areas NR, it becomes difficult to visually perceive the two-dimensional codes 45 and 46. Each of the semiconductor power devices 20 is, therefore, shaped to have an area ER other than the invisible area NR on the upper surface 40 and has the data-retaining areas 44 defined within the visible area ER. In the example illustrated in FIG. 5, the invisible area NR is located closer to the first side surface 42a of the semiconductor power device 20 than a broken line DT is. The visible area ER is located closer to the second side surface 42b than the broken line DT is.

Each of the semiconductor power devices 22 is designed to have the data-retaining areas 44 located within the visible area ER to secure the visibility of the two-dimensional codes 45 and 46. This facilitates the ease with which the characteristic data is read out of the two-dimensional codes 45 and 46 and then transferred to the arithmetic control device 20 in the structure of the battery unit 10 in which the semiconductor power devices 22 are located behind the circuit board 12, as viewed from above the upper surface of the battery unit 10, in other words, as viewed inwardly facing the bottom 31 from outside the circuit board 12, without having to increase the size of the battery unit 10.

This embodiment is designed to ensure the visible area ER in the following way. The peripheral wall 32 of the base 17, as clearly illustrated in FIG. 1, has the first and second side walls 32a and 32b which face each other through the space 30 in the widthwise direction of the battery unit 10. The circuit board 12 has the first side edge 120a (i.e., an upper side edge, as viewed in FIG. 2) and the second side edge 120b (i.e., a lower side edge, as viewed in FIG. 2) which face each other in the widthwise direction of the battery unit 10. The first side edge 120a of the circuit board 12 is located closer to the first side wall 32a of the base 17 than the second side edge 120b to the second side wall 32b of the base 17. In other words, the circuit board 12 is arranged closer to the first side wall 32a of the base 17 as a whole. This layout creates the void space 300 which is, as can be seen in FIG. 1, unoccupied by the circuit board 12 between the second side edge 120b of the circuit board 12 and an outermost edge (i.e., a rightmost edge, as viewed in FIG. 1) of the second side wall 32b of the base 17 in the widthwise direction and through which the data-retaining areas 44 are visible from above. In other words, the visible area ER (i.e., the data-retaining areas 44) is exposed outside the circuit board 12, that is, laid not to overlap the circuit board 12, as viewed from above the storage casing 16, that is, as viewed inwardly facing the bottom 31.

The semiconductor power devices 22 is arranged in the space 300 within the casing 16. In other words, the semiconductor power devices 22 are disposed close to the second side wall 32b of the circuit board 12. The space 300 develops the visible area ER of each of the semiconductor power devices 22.

Figure 5:
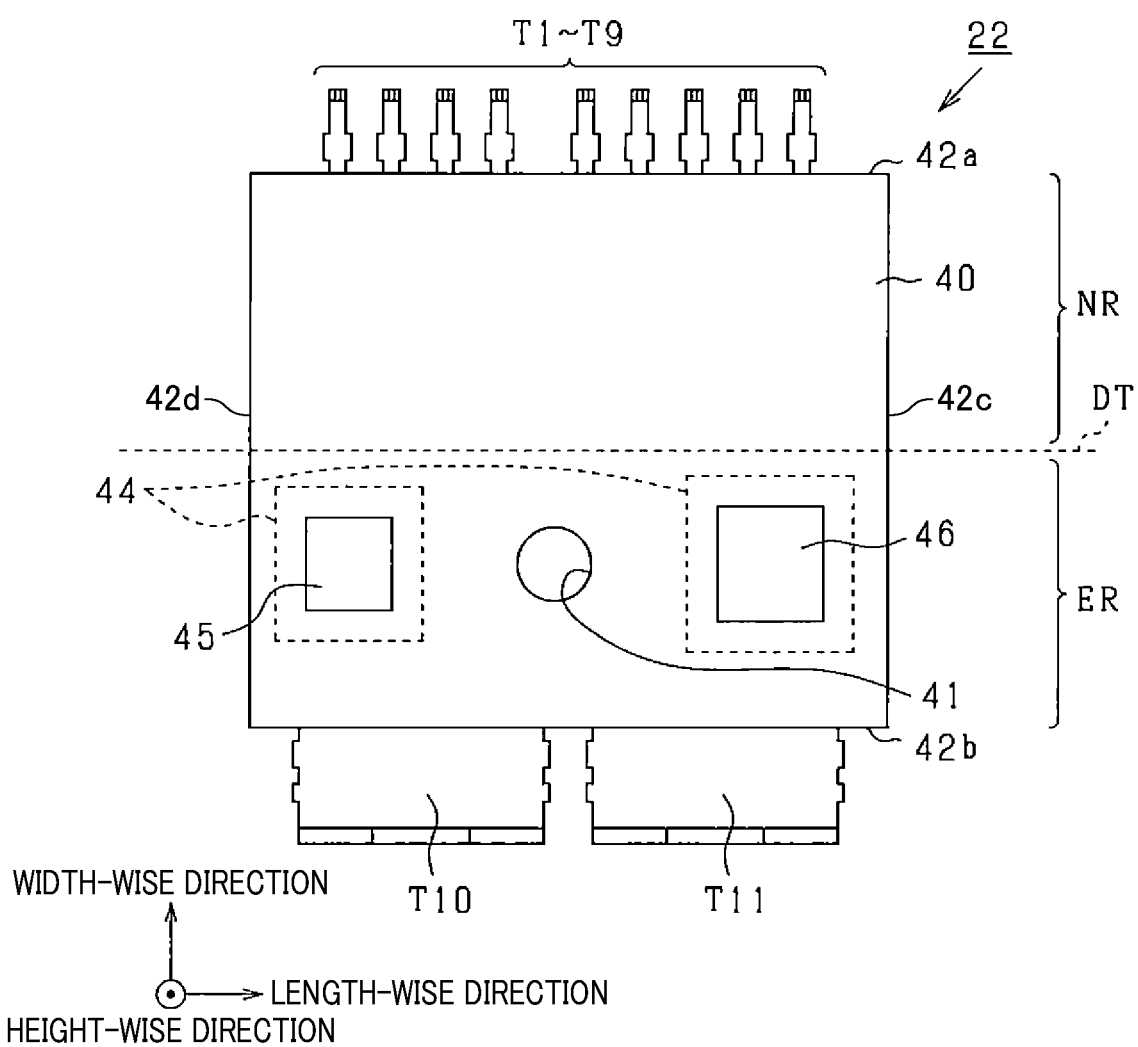
FIG. 5 is a plan view which illustrates an upper surface of a semiconductor power device installed in the battery unit in FIG. 1.

Each of the semiconductor power devices 22, as illustrated in FIG. 5, has the connecting terminals T1 to T9 which are disposed on the first side surface 42a of the first side wall 32a and are connected to the circuit board 12. The second side wall 32b of each of the semiconductor power devices 22 on which the connecting terminals T1 to T9 are not disposed is, therefore, laid not to overlap the circuit board 12 in the vertical direction.

Each of the semiconductor power devices 22 has the data-retaining areas 44 located closer to the second side wall 32b than to the first side wall 32a. Specifically, the data-retaining areas 44 are arranged closer to the second side surface 42b (i.e., the rightmost edge of the second side wall 32b) than the bisector DP extending perpendicular to the side surfaces 42c and 42d of the semiconductor power device 22 which are opposed to each other in the lengthwise direction of the battery unit 10. The data-retaining areas 44, therefore, lie within the visible area ER.

Figure 7:
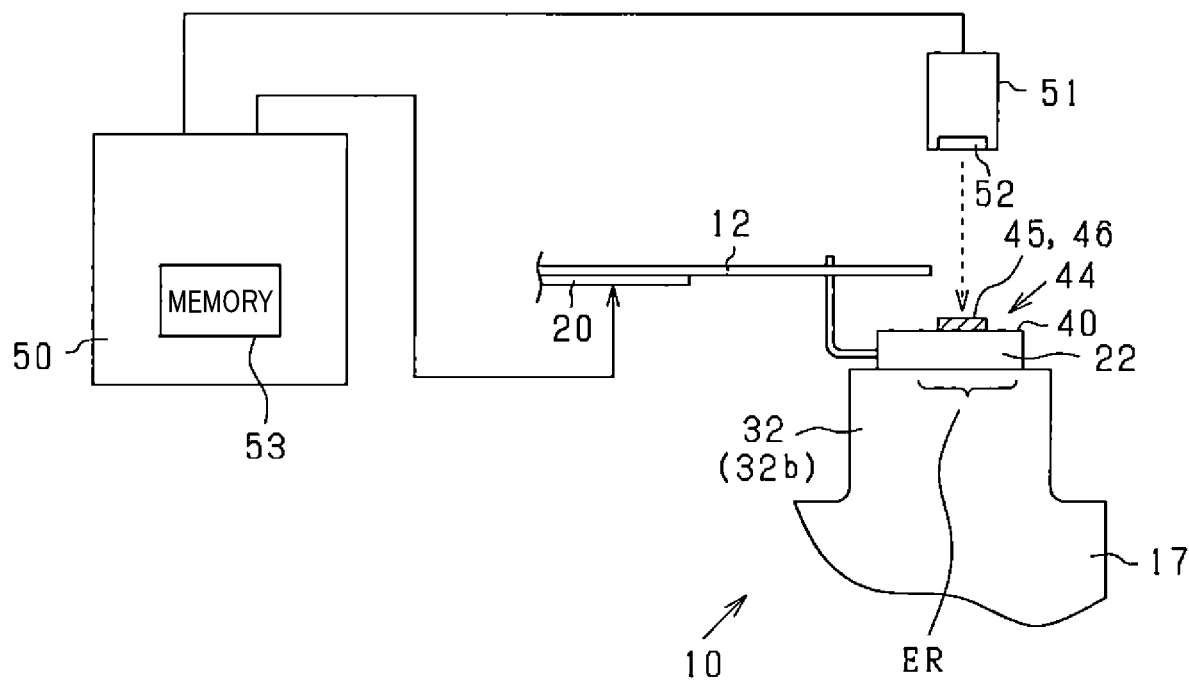
FIG. 7 is a schematic view which illustrates a writing device which scans data and transfers it to a controller.

How to write data in the arithmetic control device 20 will be described below with reference to FIG. 7. The writing of data is achieved using the writing device 50 after the battery unit 10 is assembled completely before installed in the vehicle. The writing device 50 is equipped with the two-dimensional code reader 51. The two-dimensional code reader 51 is disposed above the battery unit 10 that is a scanned object placed to face the writing device 50. The cover 18 is removed from the battery unit 10. The scanner (i.e., sensor) 52 of the two-dimensional code reader 51 is placed to face the data-retaining area 44 of the upper surface 40 of the semiconductor power device 22. For the sake of visibility, FIG. 7 three-dimensionally illustrates the two-dimensional codes 45 and 46 typed or printed on the data-retaining areas 44.

The data-retaining areas 44 of the upper surface 40 of each of the semiconductor power devices 22 are, as described above, arranged out of alignment with the circuit board 12 in the vertical direction of the battery unit 10. The scanner 52 of the two-dimensional code reader 51 is located above the two-dimensional codes 45 and 46 in the vertical direction.

The writing device 50 reads the two-dimensional codes 45 and 46 out of the data-retaining areas 44 using the two-dimensional code reader 51 and derives the characteristic data contained in the two-dimensional codes 45 and 46 by look-up using a characteristic map stored in the memory 53 of the writing device 50. The characteristic map lists data associated with information read out of the two-dimensional codes 45 and 46.

The writing device 50 is connected to the circuit board 12 through a connector, not shown, mounted on the circuit board 12 and writes the characteristic data derived from the two-dimensional codes 45 and 46 into the memory installed in the arithmetic control device 20. The transferring operation to transfer the characteristic data to the memory of the arithmetic control device 20 is, therefore, required to electrically connect the writing device 50 to the circuit board 12, while the reading operation to read or scan the two-dimensional codes 45 and 46 on the semiconductor power devices 22 is not required to connect the writing device 50 to the semiconductor power devices 22, thereby facilitating the writing operation to read and write the characteristic data in the arithmetic control device 20 as a whole.

This embodiment offers the following beneficial advantages.

The battery unit 10 equipped with the semiconductor power devices 22 which control charge or discharge of the battery module 11 is, as described above, designed to have the arithmetic control device 20 mounted on the circuit board 12 to which the semiconductor power devices 22 are connected in order to reduce the size of the battery unit 10. The battery unit 10 has the circuit board 12 arranged above the base 17 of the storage casing 16 and also has the semiconductor power devices 22 arranged behind the circuit board 12 as viewed from above the base 17 in the vertical direction of the battery unit 10.

The peripheral wall 32 of the base 17 includes the device mount base 37 for dissipating heat generated by the semiconductor power devices 22. The upper surface 37a of the device mount base 37 is located below the lower surface 12b of the circuit board 12. Accordingly, when the semiconductor power devices 22 mounted on the upper surface 37a of the device mount base 37 are connected to the circuit board 12, the semiconductor power devices 22 are located in back of the circuit board 12, as viewed from above the circuit board 12. This layout causes the semiconductor power devices 22 to be visually blocked by the battery module 11 or the circuit board 12, but it is required to secure the visibility of the two-dimensional codes 45 and 46 provided on the upper surface 40 of each of the semiconductor power devices 22 in order to facilitate writing or transferring the characteristic data contained in the two-dimensional codes 45 and 46 to the arithmetic control device 20.

In order to meet the above requirement, the battery unit 10 is, as described above, designed to have the data-retaining areas 44 on which the two-dimensional codes 45 and 46 are typed or printed and which are located within the visible area ER of the upper surface 40 of each of the semiconductor power devices 22 where the two-dimensional codes 45 and 46 are visually or optically perceived, that is, enabled to be scanned by the two-dimensional code reader 51. The above layout of the data-retaining areas 33 of each of the semiconductor power devices 22 arranged behind the circuit board 12 facilitates writing or transfer of the characteristic data contained in the two-dimensional codes 45 and 46 to the arithmetic control device 20 without need for increasing the size of the battery unit 10.

In order to secure the visible area ER, the circuit board 12 is, as described above, arranged close to the first side wall 32a of the base 17 as a whole. This layout creates the void space 300 unoccupied by the circuit board 12 between the second side edge 120b of the circuit board 12 and the outermost edge (i.e., the rightmost edge, as viewed in FIG. 1) of the second side wall 32b of the base 17 in the widthwise direction and through which the data-retaining areas 44 are visible from above. The semiconductor power devices 22 is arranged in the space 300 within the casing 16. In other words, the semiconductor power devices 22 are disposed close to the second side wall 32b of the circuit board 12. The space 300 develops the visible area ER of each of the semiconductor power devices 22.

Each of the semiconductor power devices 22, as described above in FIG. 5, has the connecting terminals T1 to T9 which are disposed on the first side surface 42a of the first side wall 32a and are connected to the circuit board 12. The second side wall 32b of each of the semiconductor power devices 22 on which the connecting terminals T1 to T9 are not disposed is, therefore, laid not to overlap the circuit board 12 in the vertical direction. The data-retaining areas 44 of the upper surface 40 of the semiconductor power device 22 are arranged closer to the second side surface 42b than to the first side surface 42a, thereby securing the visibility of the two-dimensional codes 45 and 46.

Second Embodiment

The second embodiment will be described below in terms of structural elements different from those in the first embodiment with reference to FIGS. 8 and 9. The same reference numbers as employed in FIGS. 1 and 7 will refer to the same parts, and explanation thereof in detail will be omitted here.

Figure 8:
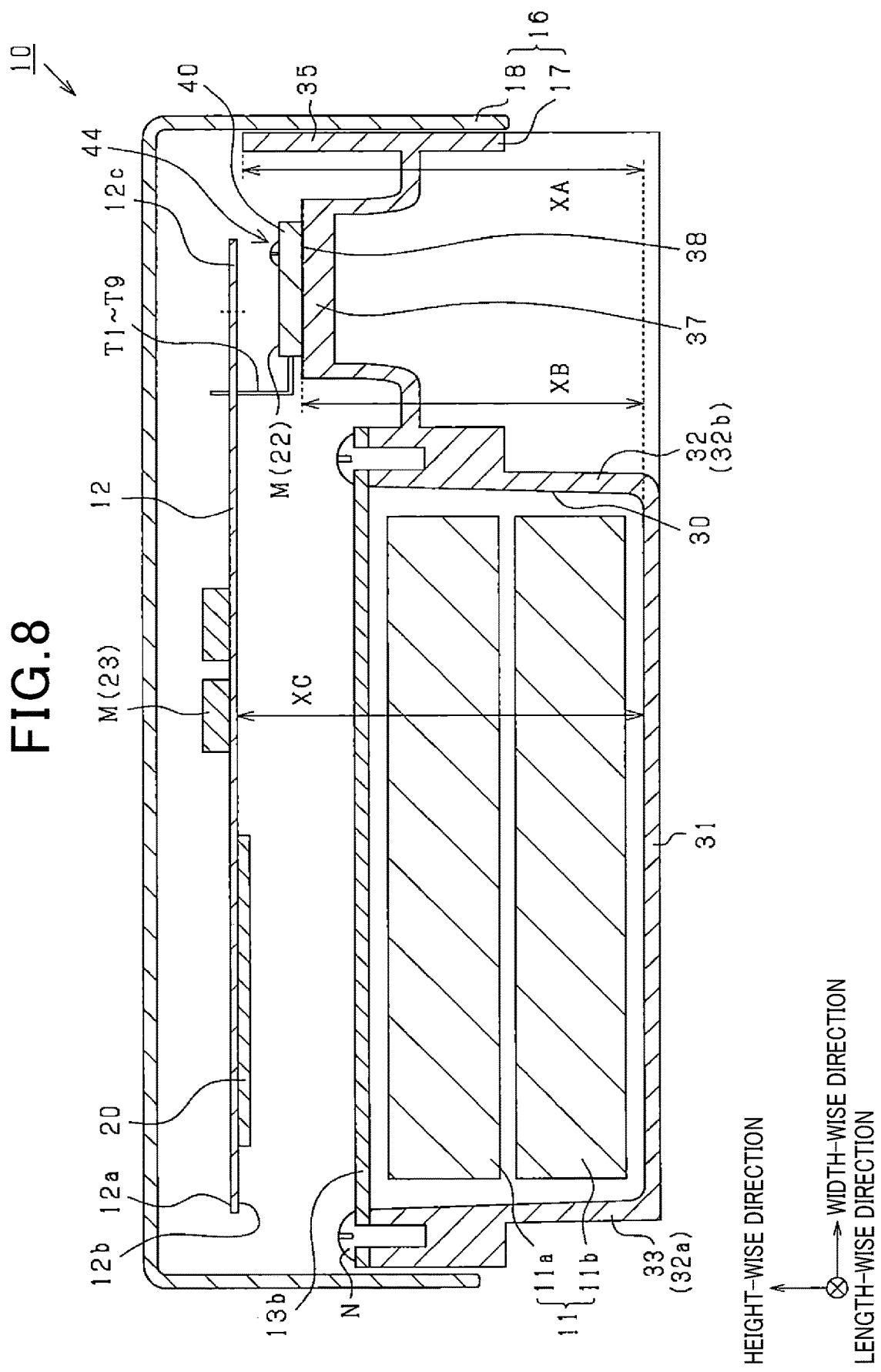
FIG. 8 is a vertical sectional view which illustrates a battery unit according to the second embodiment.

The circuit board 12 and the base 17 are, as clearly illustrated in FIG. 8, different in configuration from those in the first embodiment. Specifically, the battery unit 10 in this embodiment has the circuit board 12 which is equipped with the extension 12c laid to overlap the data-retaining areas 44 of the upper surface 40 of each of the semiconductor power devices 22 in the vertical direction.

The second side wall 32b of peripheral wall 32 of the base 17 is equipped with the protective wall 35 which extends from the device mount base 37 and faces the device mount base 37. The protective wall 35 is formed by a portion of the second side wall 32b and faces the semiconductor power devices 22 in the widthwise direction. The protective wall 35 has a top end horizontally lying flush with the top of the triple cell stack made up of three of the cells 11a. The protective wall 35 of the second side wall 32b has a height XA from the bottom 31. The device mount base 37 has a height XB from the bottom 31. The height XA is larger than the height XB. The extension 12c of the circuit board 12 and the protective wall 35 of the second side wall 32b result in a larger deterioration of visibility of the semiconductor power devices 22 than in the first embodiment.

In order to alleviate the above drawback to secure the visibility of the two-dimensional codes 45 and 46 on the upper surface 40 of each of the semiconductor power devices 22, the extension 12c of the circuit board 12 and the protective wall 35 of the second side wall 32b are designed to have the following structures. Specifically, the extension 12c of the circuit board 12 does not fully cover the upper surfaces of the semiconductor power devices 22. In other words, a portion of each of the semiconductor power devices 22 is exposed outside the circuit board 12, as viewed from above the circuit board 12, that is, as viewed inwardly facing the bottom 31. The height XA of the protective wall 35 of the second side wall 32b (i.e., a distance between the top end of the protective wall 35 and the bottom 31) is smaller than the distance XC between the bottom 31 and the lower surface 12b of the circuit board 12.

Figure 9:
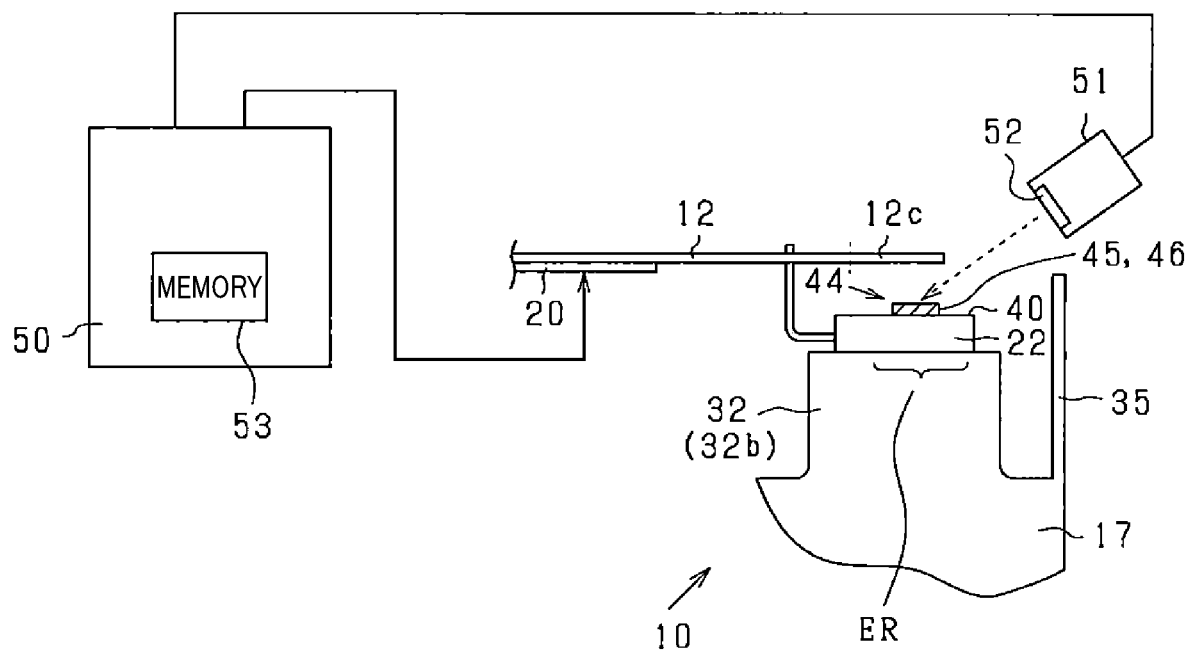
FIG. 9 is a schematic view which illustrates a writing device which scans data and transfers it to a controller in the second embodiment.

The above layout of the protective wall 35 and the circuit board 12 enables, as can be seen in FIG. 9, the visible area ER of each of the semiconductor power devices 22 to be visually or optically perceived by the two-dimensional code reader 51 diagonally through a gap between the extension 12c of the circuit board 12 and the protective wall 35 of the second side wall 32b. The data-retaining areas 44 in which the two-dimensional codes 45 and 46 are provided lie within the visible area ER. This enables the two-dimensional codes 45 and 46 to be optically perceived by the two-dimensional code reader 51 through the gap between the extension 12c of the circuit board 12 and the protective wall 35 of the second side wall 32b.

The second embodiment offers the following beneficial advantages.

If the semiconductor power devices 22 are laid to overlap the circuit board 12 completely in the vertical direction, as viewed from above the upper opening of the base 17, it will cause the circuit board 12 to optically block the two-dimensional codes 45 and 46. If the height XA of the protective wall 35 of the second side wall 32b is larger than the distance XC between the bottom 31 and the lower surface 12b of the circuit board 12, it will cause the two-dimensional codes 45 and 46 to be visually blocked by the protective wall 35 as well as the circuit board 12, thereby resulting in a failure in optically perceiving the two-dimensional codes 45 and 46.

In order to eliminate the above problem, the battery unit 10 in the second embodiment is designed to have the semiconductor power devices 22 protruding outside the circuit board 12 and also have the height XA of the protective wall 35 smaller than the distance XC between the bottom 31 and the circuit board 12, thereby securing the optical visibility of the two-dimensional code reader 51 from above the circuit board 12.

Other Modifications

The above embodiments may be modified in the following ways.

The above described characteristic data may contain temperature characteristics of an on-resistance of the switching devices M1 and M2 in addition to or instead of the temperature characteristics of the resistor RA or the voltage characteristics of the thermostatic diodes DB1 and DB2.

The characteristic data may alternatively be retained by a barcode or a string of characters, such as numerals or alphabetic characters.

The characteristic data may be typed or printed directly on the data-retaining areas 44. Alternatively, a seal on which the characteristic data is typed or printed may be adhered to each of the data-retaining areas 44.

Instead of the heat-dissipating space 34, a heat sink may be disposed on the peripheral wall 32.

In the above embodiments, only two of the switches SW1 to SW4, that is, the first and second switches SW1 and SW2 working to establish or block flow of a large amount of electrical current therethrough are made of the semiconductor power devices 22 and mounted on the device mount base 37 for releasing heat generated thereby, but however, all the switches SW1 to SW4 may be made of the semiconductor power devices 22 and arranged on the device mount base 37.

In the above embodiments, the characteristic data is, as described above, typed on the semiconductor power devices 22, but however, data on characteristics of each of the semiconductor devices 23 may be provided on an upper surface of the semiconductor device 23 mounted on the circuit board 12 together with the semiconductor power devices 22.

Each of the cells 11a is made of a can-shaped cell, but however, may alternatively be implemented by a laminated-type cell. Each of the cells 11a may alternatively be made of a secondary cell, such as a nickel-cadmium storage cell or a nickel-hydride storage cell.

What is claimed is:

1. A battery unit comprising:
   a battery;
   a storage casing which includes a bottom and a peripheral wall, the bottom and the peripheral wall defining an inner space in which the battery is disposed;
   a circuit board which is disposed inside the storage casing and on which a controller is mounted to control input or output of electrical power to or from the battery, the circuit board having an outer surface facing outside the storage casing and an inner surface facing the bottom of the storage casing, and
   a switching device which works to open or close an electrical power path leading to the battery in response to a switching signal outputted from the controller,
   wherein the battery is disposed on the bottom, the circuit board being arranged farther away from the bottom than from the battery,
   the switching device is arranged behind the circuit board within the storage casing, as viewed facing towards an interior of the storage casing from outside the outer surface of the circuit board, and
   a visible area is defined inside the storage casing, the visible area being exposed outside the circuit board to secure visibility of the visible area, as viewed facing an interior of the storage casing from outside the outer surface of the circuit board, the visible area including a data retaining area on which data on characteristics of the switching device is provided.

2. The battery unit as set forth in claim 1, wherein the peripheral wall of the storage casing includes a first side wall and a second side wall which are opposed to each other through the space in a given direction, and wherein the circuit board is located closer to the first side wall than the switching device is, while the switching device is located closer to the second side wall than the circuit board is.

3. The battery unit as set forth in claim 2, wherein the switching device has a first end closer to the first side wall of the peripheral wall of the storage casing and a second end closer to the second side wall of the peripheral wall of the storage casing, wherein the first end has installed thereon connecting terminals connecting with the circuit board, and wherein the data retaining area is located closer to the second end than to the first end on a selected surface of the switching device.

4. The battery unit as set forth in claim 2, wherein the switching device has a portion protruding outside the circuit board in a direction parallel to a major surface of the circuit board, and wherein a height of a portion of the second side wall on which the switching device is mounted from the bottom is smaller than a distance between the bottom and a lower surface of the circuit board.

5. The battery unit as set forth in claim 1, wherein the peripheral wall has a heat dissipator which releases heat generated by the switching device, and wherein the heat dissipator has a heat releasing surface on which the switching device is mounted and which is located closer to the bottom than a lower surface of the circuit board is.

\* \* \* \* \*